US012687946B2

(12) United States Patent
Seo et al.

(10) Patent No.: US 12,687,946 B2
(45) Date of Patent: Jul. 21, 2026

(54) INPUT SENSING PART AND DISPLAY DEVICE INCLUDING THE SAME

(71) Applicant: Samsung Display Co., Ltd., Yongin-si (KR)

(72) Inventors: Eunsol Seo, Yongin-si (KR); Jun-Young Ko, Seoul (KR); Keeyong Kim, Hwaseong-si (KR); Junghun Sin, Seoul (KR); Junseong Lee, Hwaseong-si (KR); Jaewoo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 17/871,746

(22) Filed: Jul. 22, 2022

(65) Prior Publication Data

US 2023/0056187 A1    Feb. 23, 2023

(30) Foreign Application Priority Data

Aug. 17, 2021    (KR) ........................ 10-2021-0108345

(51) Int. Cl.
| | |
|---|---|
| *G06F 3/041* | (2006.01) |
| *G06F 3/044* | (2006.01) |
| *H10K 59/131* | (2023.01) |
| *H10K 59/40* | (2023.01) |
| *H10K 59/88* | (2023.01) |
| *G04G 21/08* | (2010.01) |

(52) U.S. Cl.
CPC ........ *G06F 3/04164* (2019.05); *G06F 3/0412* (2013.01); *G06F 3/0443* (2019.05); *H10K*

*59/131* (2023.02); *H10K 59/40* (2023.02); *H10K 59/88* (2023.02); *G04G 21/08* (2013.01)

(58) Field of Classification Search
None
See application file for complete search history.

(56) References Cited

U.S. PATENT DOCUMENTS

| | | | |
|---|---|---|---|
| 10,564,743 | B2 | 2/2020 | Kang |
| 2015/0212627 | A1 | 7/2015 | Hotelling |
| 2016/0291710 | A1* | 10/2016 | Kang .................... G06F 3/0487 |

(Continued)

FOREIGN PATENT DOCUMENTS

| | | | | |
|---|---|---|---|---|
| CN | 105242814 A | * | 1/2016 | |
| CN | 109656409 A | * | 4/2019 | ........... G06F 3/0412 |

(Continued)

OTHER PUBLICATIONS

Translation of CN-109656409-A into English, Cai et al. (Year: 2019).*
Translation of CN-105242814-A into English; He. (Year: 2016).*

*Primary Examiner* — Brian M Butcher
(74) *Attorney, Agent, or Firm* — Womble Bond Dickinson (US) LLP

(57) ABSTRACT

An input sensing part includes: a plurality of first sensing electrodes in an active area; a plurality of second sensing electrodes in the active area and adjacent to the first sensing electrodes; a plurality of first sensing lines in an inactive area around the active area, extending to the active area, and connected to the first sensing electrodes via portions of the first and second sensing electrodes in a plan view; and a plurality of second sensing lines in the inactive area and extending from the second sensing electrodes.

20 Claims, 12 Drawing Sheets

(56) References Cited

U.S. PATENT DOCUMENTS

2017/0038859 A1      2/2017  Park et al.
2017/0301314 A1*  10/2017  Kim ........................ G04G 21/08

FOREIGN PATENT DOCUMENTS

KR      10-2016 0117719  A      10/2016
KR      10-2017-0016554  A       2/2017
KR              10-1767461  B1       8/2017
KR      10-2020-0109644  A       9/2020

* cited by examiner

INPUT SENSING PART AND DISPLAY DEVICE INCLUDING THE SAME

CROSS-REFERENCE TO RELATED APPLICATION

The present application claims priority to and the benefit of Korean Patent Application No. 10-2021-0108345, filed on Aug. 17, 2021, the entire content of which is incorporated herein by reference.

BACKGROUND

1. Field

Aspects of some embodiments of the present disclosure relate to an input sensing part and a display device including the same.

2. Description of the Related Art

Electronic devices that display images to a user, such as smart phones, digital cameras, notebook computers, a navigation unit, and a smart television, include a display device to display the images. The display device generates the images and provides the images to the user through a display screen.

The display device includes a display panel generating the images and an input sensing part arranged on the display panel to sense an external input. The input sensing part includes sensing electrodes to sense the external input and sensing lines connected to the sensing electrodes. The sensing electrodes are arranged in an active area, and the sensing lines are arranged in an inactive area. In order to provide an area for the arrangement of the sensing lines, the size or footprint of the inactive area may increase.

The above information disclosed in this Background section is only for enhancement of understanding of the background and therefore the information discussed in this Background section does not necessarily constitute prior art.

SUMMARY

Aspects of some embodiments of the present disclosure include an input sensing part having a reduced inactive area.

Some embodiments of the present disclosure include a display device including the input sensing part.

According to some embodiments of the present disclosure, an input sensing part includes a plurality of first sensing electrodes in an active area, a plurality of second sensing electrodes in the active area and adjacent to the first sensing electrodes, a plurality of first sensing lines in an inactive area around the active area, extending to the active area, and connected to the first sensing electrodes via portions of the first and second sensing electrodes when viewed in a plane, and a plurality of second sensing lines in the inactive area and extending from the second sensing electrodes.

According to some embodiments of the present disclosure, an input sensing part includes a plurality of first-first sensing portions adjacent to a center area and arranged in a radial shape with respect to the center area, a plurality of first-second sensing portions spaced apart from the first-first sensing portions in a radial direction and connected to the first-first sensing portions, a plurality of second-first sensing portions between the first-first sensing portions and the first-second sensing portions, a plurality of second-second sensing portions spaced apart from the second-first sensing portions in the radial direction, outside the first-second sensing portions, and respectively connected to the second-first sensing portions, a plurality of first sensing lines extending toward the center area and connected to the first-first sensing portions, and a plurality of second sensing lines extending from the second-second sensing portions.

According to some embodiments of the present disclosure, a display device includes a display panel and an input sensing part on the display panel. The input sensing part includes a plurality of first sensing electrodes in an active area, a plurality of second sensing electrodes in the active area and adjacent to the first sensing electrodes, a plurality of first sensing lines in an inactive area around the active area, extending to the active area, and connected to the first sensing electrodes via portions of the first and second sensing electrodes when viewed in a plane, and a plurality of second sensing lines in the inactive area and extending from the second sensing electrodes.

According to some embodiments, the first sensing lines may extend to the active area and may not extend to the inactive area, and the first sensing lines are connected to the first sensing electrodes after passing through portions of the first and second sensing electrodes. As the first sensing lines extend to the active area without extending to the inactive area, the inactive area may be reduced.

BRIEF DESCRIPTION OF THE DRAWINGS

The above and other characteristics of embodiments according to the present disclosure will become readily apparent by reference to the following detailed description when considered in conjunction with the accompanying drawings wherein.

DETAILED DESCRIPTION

Figure 1:
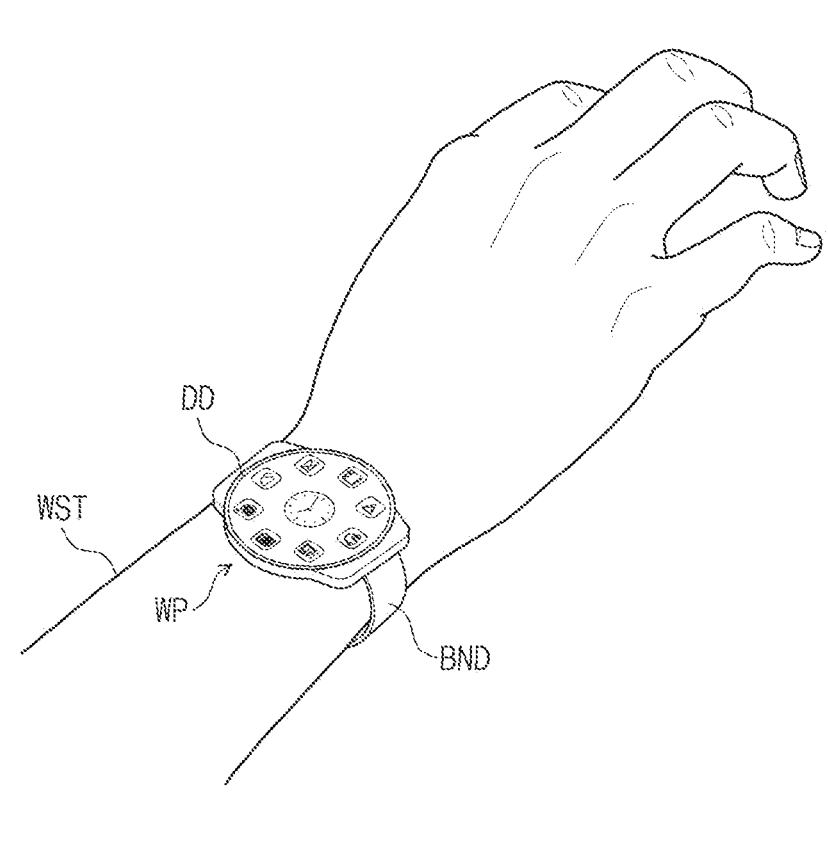
FIG. 1 is a perspective view showing a watch phone including a display device according to some embodiments of the present disclosure.
Figure 1:
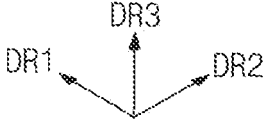

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments according to the present disclosure will be explained in more detail with reference to the accompanying drawings.

Figure 2:
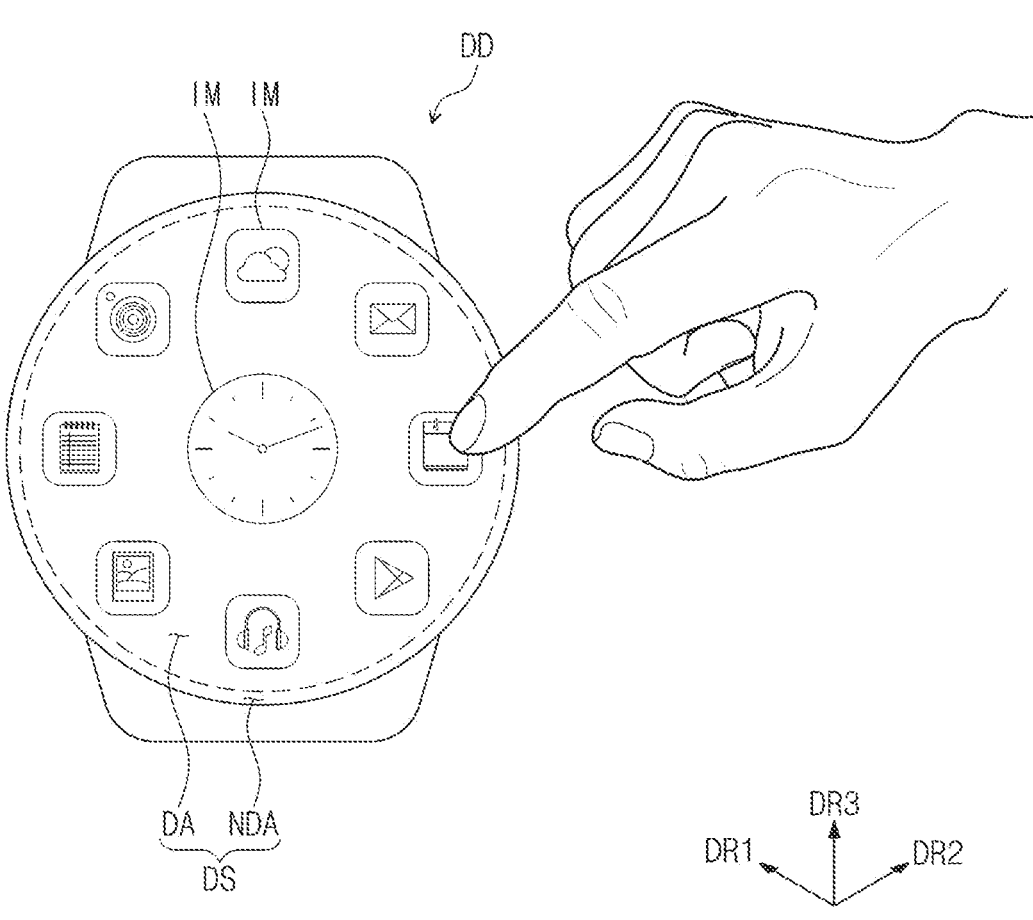
FIG. 2 is a plan view showing the display device of the watch phone shown in FIG. 1 according to some embodiments of the present disclosure.

FIG. 1 is a perspective view showing a watch phone WP including a display device DD according to some embodiments of the present disclosure. FIG. 2 is a plan view showing the display device DD of the watch phone shown in FIG. 1.

Referring to FIGS. 1 and 2, a user may use the watch phone WP while wearing the watch phone WP on his/her wrist. The watch phone WP may include the display device DD and a band BND connected to the display device DD. The user may wear the watch phone WP on his/her wrist WST by placing the band BND around the wrist WST. The display device DD may be arranged to face the user.

The watch phone WP may provide a variety of images IM to the user. The images IM may display time and various applications. As an example, the display device DD of the watch phone WP may display an hour hand and a minute hand, which indicate the time, and may tell the user what time it is. In addition, the display device DD may display the various applications to the user.

The display device DD may be a touch type display device. As an example, when the user touches the applications displayed on the display device DD, the touched applications may be executed. For example, when the user touches an application for weather forecast among the applications displayed on the display device DD, weather information may be provided to the user.

An upper surface of the display device DD may be referred to as a display surface DS and may be a plane defined by a first direction DR1 and a second direction DR2. The first direction DR1 and the second direction DR2 may be substantially perpendicular to each other. Images IM generated by the display device DD may be provided to the user through the display surface DS.

Hereinafter, a direction substantially perpendicular to the plane defined by the first direction DR1 and the second direction DR2 may be referred to as a third direction DR3. In the present disclosure, the expression "when viewed in a plane" or "in a plan view" may mean a state of being viewed in or from the third direction DR3.

The display surface DS may include a display area DA and a non-display area NDA around the display area DA. The display area DA may display the images, and the non-display area NDA may not display the images. The non-display area NDA may surround the display area DA and may define an edge of the display device DD, which is printed by a color (e.g., a set or predetermined color).

When viewed in a plane, the display device DD may have a circular shape, however, the shape of the display device DD should not be limited to the circular shape. According to some embodiments, the display device DD may have various shapes, such as a quadrangular shape, a polygonal shape, or an oval shape.

Figure 3:
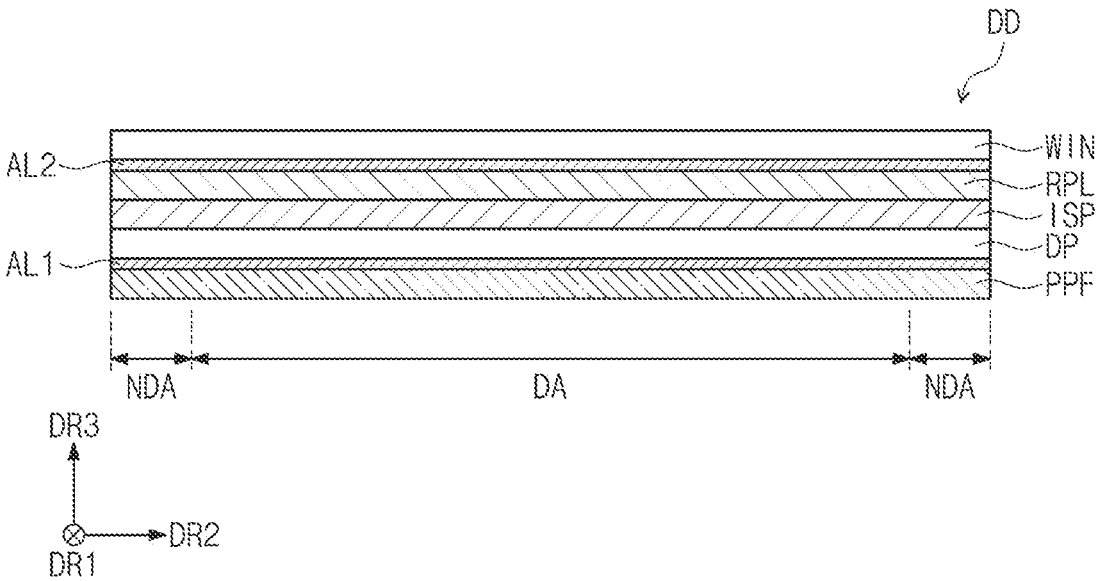
FIG. 3 is a cross-sectional view showing the display device shown in FIG. 2 according to some embodiments of the present disclosure.

FIG. 3 is a cross-sectional view showing the display device DD shown in FIG. 2.

FIG. 3 shows a cross-section of the display device DD when viewed in the first direction DR1.

Referring to FIG. 3, the display device DD may include a display panel DP, an input sensing part ISP, an anti-reflective layer RPL, a window WIN, a panel protective film PPF, and first and second adhesive layers AL1 and AL2.

The display panel DP may be a flexible display panel. The display panel DP may be a light-emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP.

The input sensing part ISP may be arranged on the display panel DP. The input sensing part ISP may include a plurality of sensing portions (shown in FIGS. 6A and 6B) to sense the external input by a capacitive method. The input sensing part ISP may be manufactured directly on the display panel DP when the display device DD is manufactured, however, it should not be limited thereto or thereby. According to some embodiments, the input sensing part ISP may be attached to the display panel DP by an adhesive layer after being manufactured separately from the display panel DP.

The anti-reflective layer RPL may be arranged on the input sensing part ISP. The anti-reflective layer RPL may be defined as an external light reflection preventing film. The anti-reflective layer RPL may reduce a reflectance with respect to an external light incident to the display panel DP from the above of the display device DD.

In a case where the display panel DP reflects the external light incident thereto like a mirror and the reflected external light is provided to the user, the user may perceive the external light. The anti-reflective layer RPL may include a plurality of color filters that displays the same colors as colors displayed by pixels of the display panel DP to prevent the external light from being reflected and perceived by the user.

The color filters may filter the external light to allow the external light to have the same colors as the colors displayed by the pixels. In this case, the external light may not be perceived by the user. The anti-reflective layer RPL including the color filters may be manufactured directly on the input sensing part ISP when the display device DD is manufactured.

Alternatively, the anti-reflective layer RPL may include a polarizing film including a retarder and/or a polarizer to reduce the reflectance with respect to the external light. The anti-reflective layer RPL including the polarizing film may be attached to the input sensing part ISP by an adhesive layer after being manufactured separately from the input sensing part ISP.

The window WIN may be arranged on the anti-reflective layer RPL. The window WIN may protect the display panel DP, the input sensing part ISP, and the anti-reflective layer RPL from external scratches and impacts.

The panel protective film PPF may be arranged under the display panel DP. The panel protective film PPF may protect a lower portion of the display panel DP. The panel protective film PPF may include a flexible plastic material such as polyethylene terephthalate (PET).

The first adhesive layer AL1 may be arranged between the display panel DP and the panel protective film PPF. The display panel DP and the panel protective film PPF may be coupled to each other by the first adhesive layer AL1. The second adhesive layer AL2 may be arranged between the anti-reflective layer RPL and the window WIN. The anti-reflective layer RPL and the window WIN may be coupled to each other by the second adhesive layer AL2.

Figure 4:
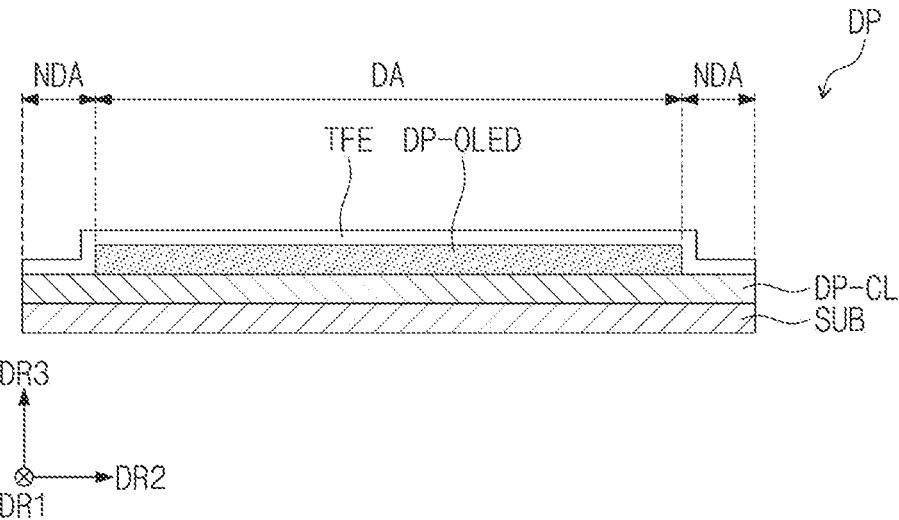
FIG. 4 is a cross-sectional view showing a display panel shown in FIG. 3 according to some embodiments of the present disclosure.

FIG. 4 is a cross-sectional view showing the display panel DP shown in FIG. 3.

FIG. 4 shows a cross-section of the display panel DP when viewed in the first direction DR1.

Referring to FIG. 4, the display panel DP may include a substrate SUB, a circuit element layer DP-CL arranged on the substrate SUB, a display element layer DP-OLED arranged on the circuit element layer DP-CL, and a thin film encapsulation layer TFE arranged on the display element layer DP-OLED.

The substrate SUB may include the display area DA and the non-display area NDA around the display area DA. The substrate SUB may include a glass material or a flexible plastic material such as polyimide (PI). The display element layer DP-OLED may be arranged in the display area DA.

A plurality of pixels may be arranged in the circuit element layer DP-CL and the display element layer DP-OLED. Each pixel may include a transistor arranged on the circuit element layer DP-CL and a light emitting element arranged on the display element layer DP-OLED and connected to the transistor. The pixel will be described in more detail later.

The thin film encapsulation layer TFE may be arranged on the circuit element layer DP-CL to cover the display element layer DP-OLED. The thin film encapsulation layer TFE may protect the pixels from moisture, oxygen, and a foreign substance.

Figure 5:
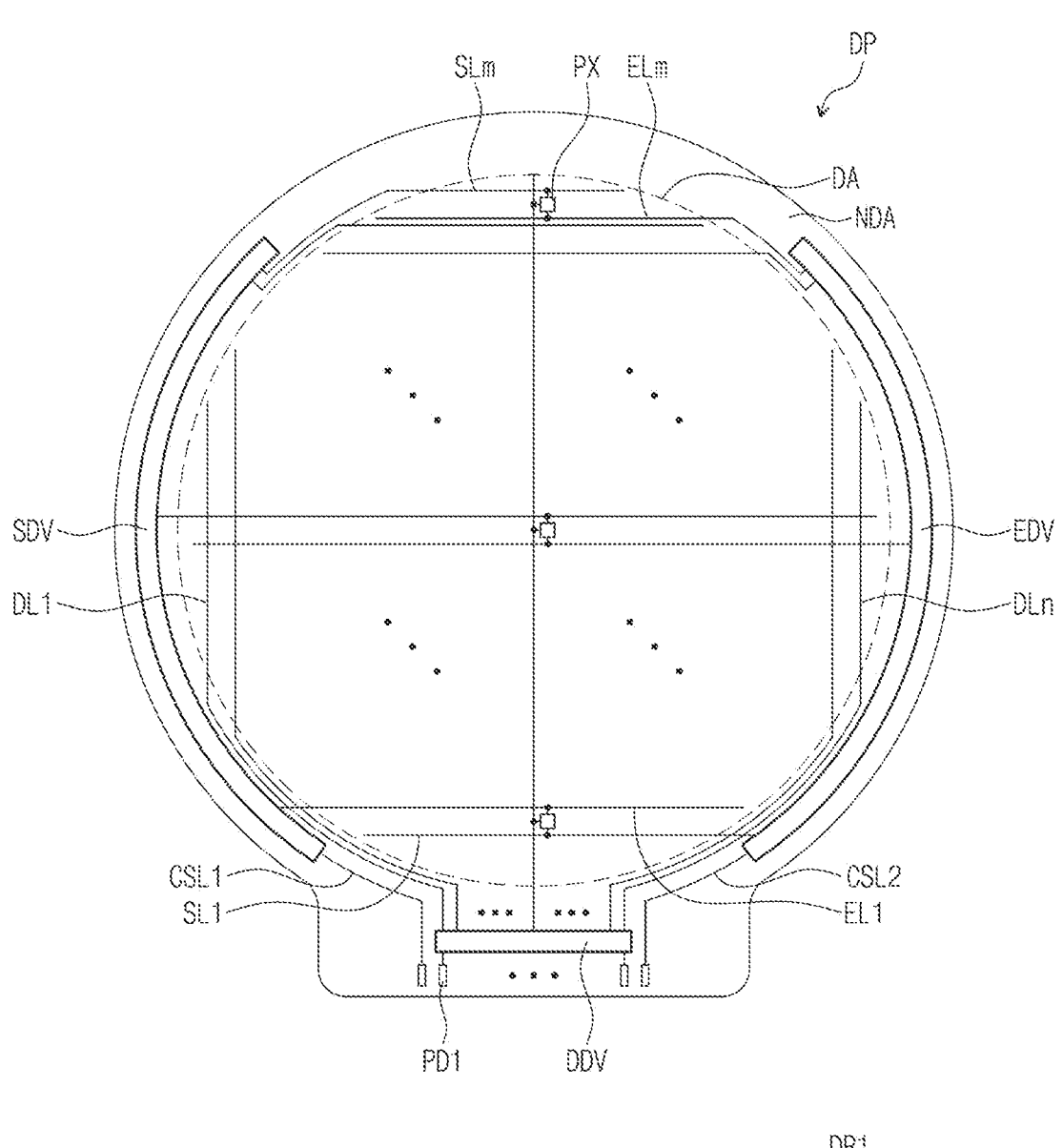
FIG. 5 is a plan view showing the display panel shown in FIG. 3 according to some embodiments of the present disclosure.

FIG. 5 is a plan view showing the display panel DP shown in FIG. 3.

Referring to FIG. 5, the display device DD may include the display panel DP, a scan driver SDV, a data driver DDV, an emission driver EDV, and a plurality of first pads PD1.

The display panel DP may have the circular shape, however, the shape of the display panel DP should not be limited thereto or thereby. As an example, a lower end of the display panel DP having the circular shape may protrude downward, and thus, the lower end of the display panel DP may have a right angled shape. The display panel DP may include the display area DA and the non-display area NDA around the display area DA. The display area DA may have a circular shape. The non-display area NDA may surround the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, and connection lines CNL. Each of "m" and "n" is a natural number.

The pixels PX may be arranged in the display area DA. The scan driver SDV and the emission driver EDV may be arranged in the non-display area NDA respectively adjacent to both sides of the display panel DP, which are opposite to each other in the second direction DR2. The data driver DDV may be arranged in the non-display area NDA to be adjacent to one side of both sides of the display panel DP, which are opposite to each other in the first direction DR1. When viewed in a plane, the data driver DDV may be arranged to be adjacent to the lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the emission driver EDV. The pixels PX may be arranged in areas defined by the scan lines SL1 to SLm, the data lines DL1 to DLn, and the emission lines EL1 to ELm.

The first control line CSL1 may be connected to the scan driver SDV and may extend toward the lower end of the display panel DP. The second control line CSL2 may be connected to the emission driver EDV and may extend toward the lower end of the display panel DP. The data driver DDV may be arranged between the first control line CSL1 and the second control line CSL2.

The first pads PD1 may be arranged in the non-display area NDA adjacent to the lower end of the display panel DP. The first pads PD1 may be arranged closer to the lower end of the display panel DP than the data driver DDV is. The data driver DDV, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

According to some embodiments, a printed circuit board may be connected to the first pads PD1, and a timing controller may be arranged on the printed circuit board. The timing controller may be manufactured in an integrated circuit (IC) chip and may be mounted on the printed circuit board. The timing controller may be connected to the first pads PD1 through the printed circuit board.

The timing controller may control an operation of the scan driver SDV, the data driver DDV, and the emission driver EDV. The timing controller may generate a scan control signal, a data control signal, and an emission control signal in response to control signals applied thereto from the outside.

The scan control signal may be applied to the scan driver SDV via the first control line CSL1. The emission control signal may be applied to the emission driver EDV via the second control line CSL2. The data control signal may be applied to the data driver DDV. The timing controller may receive image signals from the outside, may convert a data format of the image signals to a data format appropriate to an interface between the data driver DDV and the timing controller, and may provide the converted image signals to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of emission signals in response to the emission control signal. The emission signals may be applied to the pixels PX via the emission lines EL1 to ELm.

The pixels PX may receive the data voltages in response to the scan signals. The pixels PX may emit light having brightness corresponding to the data voltages in response to the emission signals to display the image.

Figure 6A:
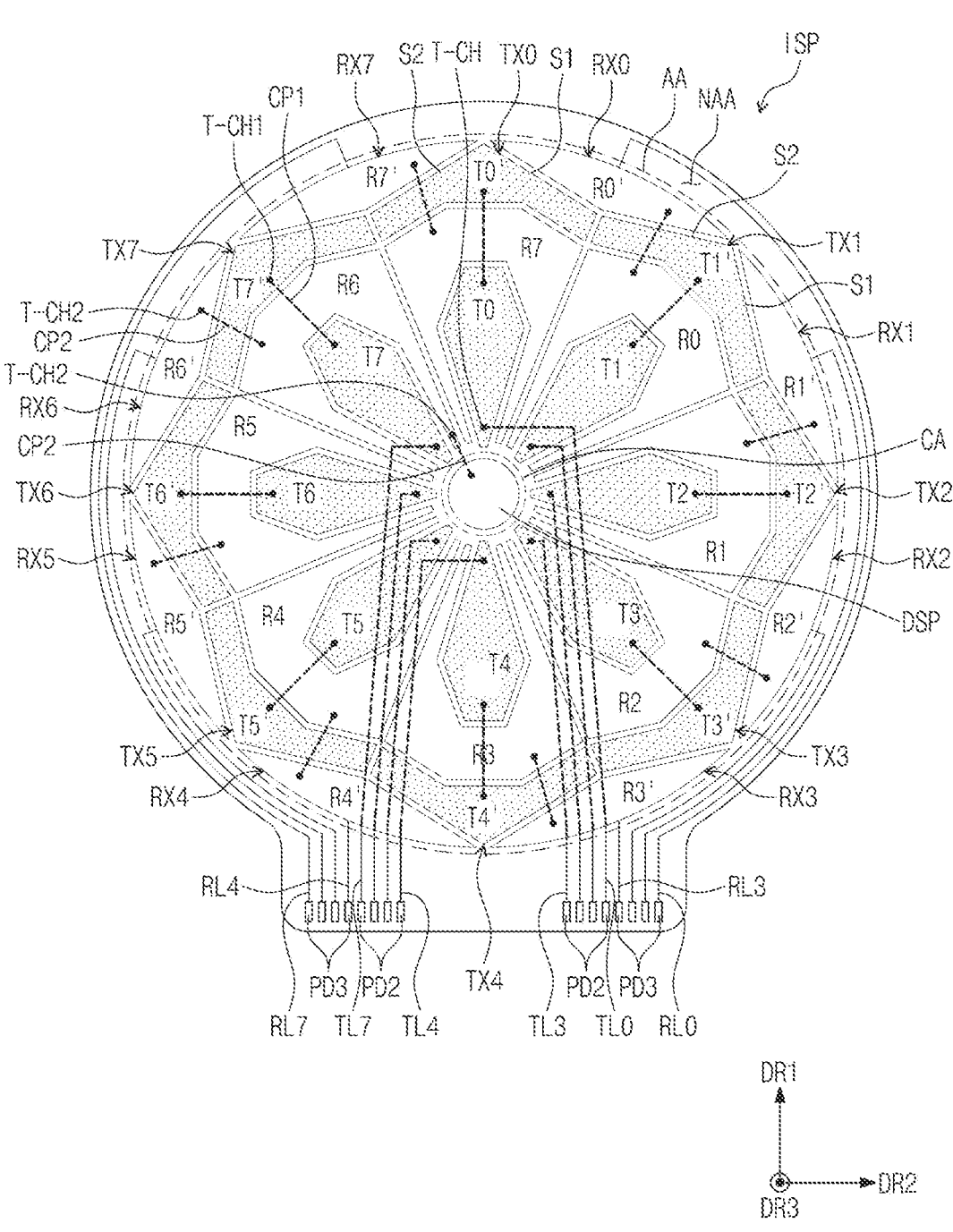
FIGS. 6A and 6B are plan views showing an input sensing part shown in FIG. 3 according to some embodiments of the present disclosure.
Figure 6B:
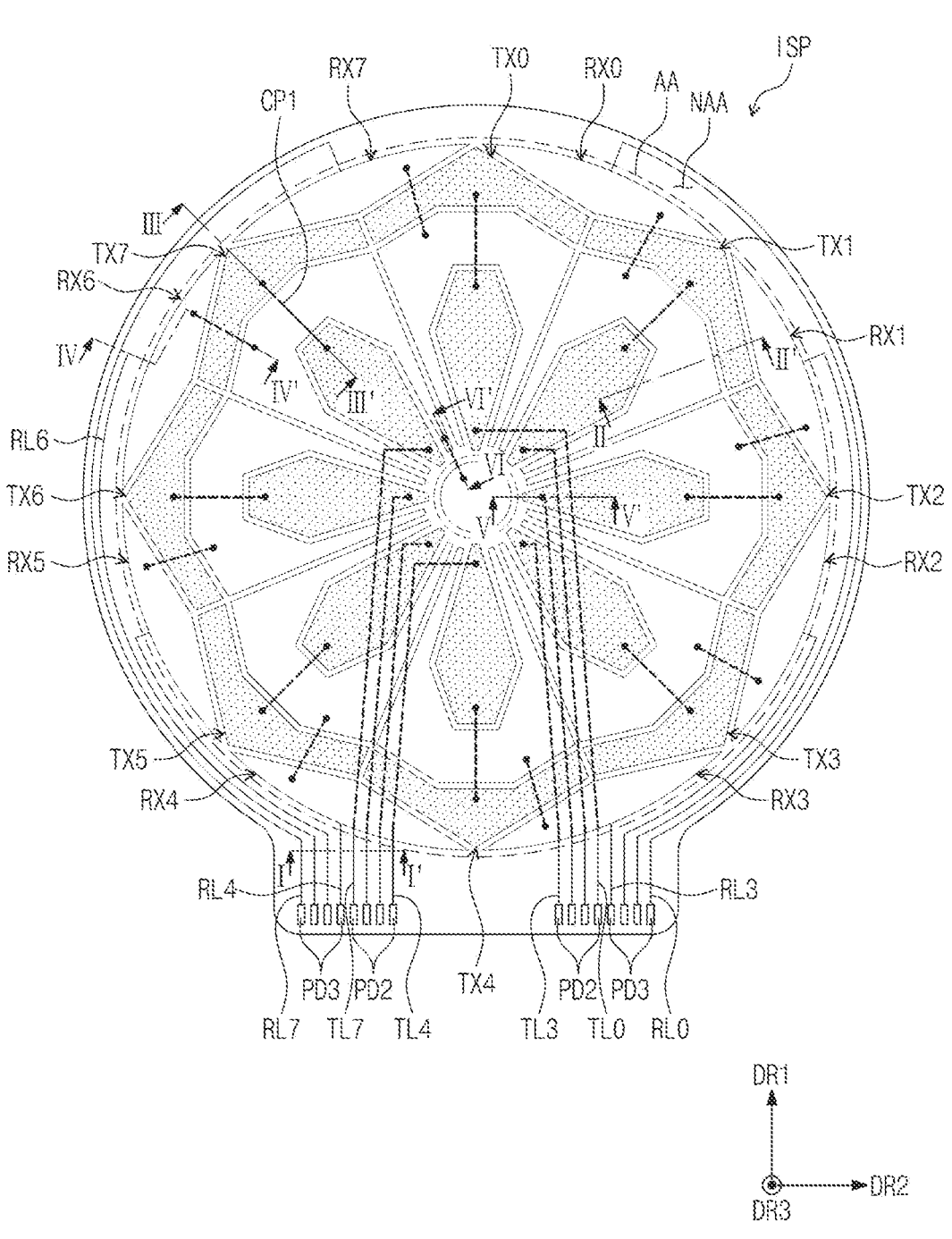

FIGS. 6A and 6B are plan views showing the input sensing part ISP shown in FIG. 3.

FIGS. 6A and 6B show substantially the same view but are shown separately because of reference numerals. Because there are a lot of reference numerals to illustrate, the reference numerals are shown separately in FIGS. 6A and 6B. In FIG. 6A, reference numerals of components arranged in an active area AA of the circular shape are shown in more detail, and in FIG. 6B, reference numerals of cross-section lines (I-I' to VI-VI') in the active area AA of the circular shape are shown. Hereinafter, FIGS. 6A and 6B, which show the same view, will be described together to explain configurations of the input sensing part ISP.

Referring to FIGS. 6A and 6B, the input sensing part ISP may include a plurality of sensing electrodes TX0 to TX7 and RX0 to RX7, a plurality of sensing lines TL0 to TL7 and RL0 to RL7, a plurality of second and third pads PD2 and PD3, a plurality of first connection patterns CP1, and a plurality of second connection patterns CP2. The sensing electrodes TX0 to TX7 and RX0 to RX7, the sensing lines TL0 to TL7 and RL0 to RL7, and the second and third pads PD2 and PD3 may be arranged on the thin film encapsulation layer TFE. Embodiments according to the present disclosure are not limited to the number of sensing electrodes, sensing lines, pads, and connection patterns illustrated in FIGS. 6A and 6B, and may include any suitable number according to the size, shape and design, of the input sensing part ISP.

The input sensing part ISP may have a circular shape (or a generally circular shape), however, the shape of the input sensing part ISP should not be limited thereto or thereby. As an example, a lower end of the input sensing part ISP having the circular shape may protrude downward, and thus, the lower end of the input sensing part ISP may have a right angled shape. Additionally, the input sensing part ISP may have various other shapes or footprints in a plan view (e.g., when viewed in a plane, or a direction perpendicular or normal to the plane defined by the directions DR1 and DR2). For example, according to some embodiments, the input sensing part ISP may have an elliptical shape, or a polygon shape.

A flat area of the input sensing part ISP may include the active area AA and an inactive area NAA around the active area AA. The active area AA may have a circular shape. The inactive area NAA may surround the active area AA.

The active area AA may overlap the display area DA, and the inactive area NAA may overlap the non-display area NDA. A center area CA may be defined at a center of the active area AA. As an example, the center area CA may have a circular shape, however, the shape of the center area CA should not be limited to the circular shape.

The sensing electrodes TX0 to TX7 and RX0 to RX7 may be arranged in the active area AA, and the second and third pads PD2 and PD3 may be arranged in the inactive area NAA. The second pads PD2 and the third pads PD3 may be arranged adjacent to the lower end of the input sensing part ISP when viewed in a plane (e.g., in a plan view).

The second pads PD2 may be arranged at left and right sides of the lower end of the input sensing part ISP. Some second pads PD2 may be arranged at the left side of the lower end of the input sensing part ISP, and the other second pads PD2 may be arranged at the right side of the lower end of the input sensing part ISP.

The third pads PD3 may be arranged at the left and right sides of the lower end of the input sensing part ISP. Some third pads PD3 may be arranged at the left side of the lower end of the input sensing part ISP, and the other third pads PD3 may be arranged at the right side of the lower end of the input sensing part ISP. The third pads PD3 may be arranged outside the second pads PD2.

According to some embodiments, when viewed in a plane, the first pads PD1 may be arranged between the second and third pads PD2 and PD3 arranged at the left side and the second and third pads PD2 and PD3 arranged at the right side.

The sensing lines TL0 to TL7 and RL0 to RL7 may be arranged in the inactive area NAA and may be connected to the sensing electrodes TX0 to TX7 and RX0 to RX7. The sensing lines TL0 to TL7 and RL0 to RL7 may be connected to the second and third pads PD2 and PD3 in the inactive area NAA. Among the sensing lines TL0 to TL7 and RL0 to RL7, some sensing lines TL0 to TL7 may extend to the active area AA and may be connected to some sensing electrodes TX0 to TX7 among the sensing electrodes TX0 to TX7 and RX0 to RX7. This structure will be described in more detail later.

According to some embodiments, a sensing controller may be connected to the second and third pads PD2 and PD3 via the printed circuit board to control the input sensing part ISP.

The sensing electrodes TX0 to TX7 and RX0 to RX7 may include a plurality of first sensing electrodes TX0 to TX7 arranged in the active area AA and a plurality of second sensing electrodes RX0 to RX7 arranged in the active area AA. The first sensing electrodes TX0 to TX7 and the second sensing electrodes RX0 to RX7 may be formed of silver, gold, copper, aluminum, platinum, palladium, chromium, titanium, tungsten, niobium, tantalum, vanadium, iron, manganese, cobalt, nickel, zinc, tin, molybdenum or alloys thereof.

The first sensing electrodes TX0 to TX7 may be arranged in a radial shape with respect to the center area CA. The first sensing electrodes TX0 to TX7 may include a plurality of first-first sensing portions T0 to T7 and a plurality of first-second sensing portions T0' to T7' respectively connected to the first-first sensing portions T0 to T7.

The second sensing electrodes RX0 to RX7 may be insulated and separated from the first sensing electrodes TX0 to TX7. The second sensing electrodes RX0 to RX7 may be arranged adjacent to the first sensing electrodes TX0 to TX7. The second sensing electrodes RX0 to RX7 may be arranged in a radial shape with respect to the center area CA. The second sensing electrodes RX0 to RX7 may include a plurality of second-first sensing portions R0 to R7 and a plurality of second-second sensing portions R0' to R7' respectively connected to the second-first sensing portions R0 to R7.

The sensing lines TL0 to TL7 and RL0 to RL7 may include a plurality of first sensing lines TL0 to TL7 connected to the first sensing electrodes TX0 to TX7 and a plurality of second sensing lines RL0 to RL7 connected to the second sensing electrodes RX0 to RX7. The first sensing lines TL0 to TL7 may be arranged in the inactive area NAA and may be connected to the second pads PD2. The second sensing lines RL0 to RL7 may be arranged in the inactive area NAA and may be connected to the third pads PD3.

The first sensing lines TL0 to TL7 may extend to the active area AA. The first sensing lines TL0 to TL7 may be connected to the first sensing electrodes TX0 to TX7 via portions of the first and second sensing electrodes TX0 to TX7 and RX0 to RX7 when viewed in a plane. The first sensing lines TL0 to TL7 extending to the active area AA may not intersect with each other, and thus, the first sensing lines TL0 to TL7 may not overlap each other.

The first sensing lines TL0 to TL7 may extend to the center area CA and may be connected to the first sensing electrodes TX0 to TX7. The first sensing lines TL0 to TL7 may be connected to portions of the first sensing electrodes TX0 to TX7, which are adjacent to the center area CA.

The second sensing lines RL0 to RL7 may be connected to an outer border of the second sensing electrodes RX0 to RX7. The second sensing lines RL0 to RL7 may be arranged on substantially the same layer as the second sensing electrodes RX0 to RX7 and may extend to the inactive area NAA from the outer border of the second sensing electrodes RX0 to RX7.

The first-first sensing portions T0 to T7 may be arranged adjacent to the center area CA. The first-first sensing portions T0 to T7 may be arranged along a border of the center area CA. The first-first sensing portions T0 to T7 may be arranged in a radial shape with respect to the center area CA. $0^{th}$ to $7^{th}$ first-first sensing portions T0 to T7 may be arranged in a clockwise direction. As an example, when viewed in a plane, the $0^{th}$ first-first sensing portion T0 may be placed at 12 o'clock, and the other first-first sensing portions T1 to T7 may be arranged in the clockwise direction, however, this is merely one example. The arrangement of the first-first sensing portions T0 to T7 should not be limited thereto or thereby.

Hereinafter, the radial direction may be defined as directions extending in all directions with respect to the center area CA.

The first-first sensing portions T0 to T7 may have a polygonal shape. As an example, the first-first sensing portions T0 to T7 may have a hexagonal shape, however, the shape of the first-first sensing portions T0 to T7 should not be limited to the hexagonal shape. The first-first sensing portions T0 to T7 may have the hexagonal shape and may extend in the radial direction.

One sides of the first-first sensing portions T0 to T7, which face the center area CA, may have a length smaller than a length of the other sides of the first-first sensing portions T0 to T7, which are opposite to the one sides of the first-first sensing portions T0 to T7.

The first-second sensing portions T0' to T7' may be spaced apart from the first-first sensing portions T0 to T7 in the radial direction and may be connected to the first-first sensing portions T0 to T7, respectively. The first-second sensing portions T0' to T7' may have a polygonal shape.

$0^{th}$ to $7^{th}$ first-second sensing portions T0' to T7' may be arranged in the clockwise direction. As an example, when viewed in a plane, the $0^{th}$ first-second sensing portion T0' may be placed at 12 o'clock, and the other first-second sensing portions T1' to T7' may be arranged in the clockwise direction, however, this is merely one example. The arrangement of the first-second sensing portions T0' to T7' should not be limited thereto or thereby.

The first-second sensing portions T0' to T7' may be respectively connected to the first-first sensing portions T0 to T7 via the first connection patterns CP1. The first connection patterns CP1 may be connected to the first-first sensing portions T0 to T7 and the first-second sensing portions T0' to T7' through first contact holes T-CH1. The first contact holes T-CH1 will be described in more detail below.

A border of each of the first-second sensing portions T0' to T7', which faces outward, may include a first side S1 and a second side S2 connected to the first side S1 to form an angle smaller than about 180 degrees. The first side S1 and the second side S2 of each of the first-second sensing portions T0' to T7' may be arranged in the counter clockwise direction.

The first sensing lines TL0 to TL7 may extend to the center area CA and may be connected to the first-first sensing portions T0 to T7. The first sensing lines TL0 to TL7 may be connected to portions of the first-first sensing portions T0 to T7, which are adjacent to the one sides of the first-first sensing portions T0 to T7, which face the center area CA. The first sensing lines TL0 to TL7 may be connected to the first-first sensing portions T0 to T7 through contact holes T-CH. The contact holes T-CH will be described in more detail below.

An h-th first-first sensing portion may extend in one direction, and an h-th first-second sensing portion may be spaced apart from the h-th first-first sensing portion in the one direction. In the present embodiment, h is an integer number equal to or greater than zero (0). As an example, in the case where the h is zero (h=0), the $0^{th}$ first-first sensing portion T0 may extend in the first direction DR1. The $0^{th}$ first-second sensing portion T0' may be spaced apart from the 0<sup>th</sup> first-first sensing portion T0 in the first direction DR1.

The first-first sensing portion T0 and the first-second sensing portion T0', which correspond to each other in a sequential order, may be arranged in the extending direction of the first-first sensing portion T0. Accordingly, the first-second sensing portions T0' to T7' may be arranged spaced apart in the radial direction to correspond to the first-first sensing portions T0 to T7, respectively.

The second-first sensing portions R0 to R7 may be arranged between the first-first sensing portions T0 to T7 and the first-second sensing portions T0' to T7'. The first-second sensing portions T0' to T7' may be arranged adjacent to the borders of the second-first sensing portions R0 to R7, which face outward, respectively. The second-first sensing portions R0 to R7 may be arranged in the radial direction with respect to the center area CA.

0<sup>th</sup> to 7<sup>th</sup> second-first sensing portions R0 to R7 may be arranged in the clockwise direction. As an example, when viewed in a plane, the 0<sup>th</sup> second-first sensing portion R0 may be arranged between a 1<sup>th</sup> first-first sensing portion T1 and a 1<sup>th</sup> first-second sensing portion T1', and the other second-first sensing portions R1 to R7 may be arranged in the clockwise direction, however, this is merely one example. The arrangement of the second-first sensing portions R0 to R7 should not be limited thereto or thereby.

The second-first sensing portions R0 to R7 may have a polygonal shape. The second-first sensing portions R0 to R7 may be arranged to surround the other sides of the first-first sensing portions T0 to T7, respectively, except the one sides of the first-first sensing portions T0 to T7, which face the center area CA.

The second-second sensing portions R0' to R7' may be spaced apart from the second-first sensing portions R0 to R7 in the radial direction and may be connected to the second-first sensing portions R0 to R7. The second-second sensing portions R0' to R7' may be arranged outside the first-second sensing portions T0' to T7', respectively. Accordingly, the first-second sensing portions T0' to T7' may be arranged between the second-first sensing portions R0 to R7 and the second-second sensing portions R0' to R7'.

Outer borders of the second-second sensing portions R0' to R7' may have a curved shape in the radial direction. The border having the circular shape may be defined by the outer borders of the second-second sensing portions R0' to R7'. The active area AA may be defined by the border of the circular shape. Each of inner borders of the second-second sensing portions R0' to R7', which are opposite to the outer borders of the second-second sensing portions R0' to R7', may include two sides forming an angle smaller than about 180 degrees.

An h-th second-second sensing portion may be arranged between a first side of the h-th first-second sensing portion and a second side of an (h+1)th first-second sensing portion. As an example, a 0<sup>th</sup> second-second sensing portion R0' may be arranged between the first side S1 of the 0<sup>th</sup> first-second sensing portion T0' and the second side S2 of the 1<sup>th</sup> first-second sensing portion T1'.

0<sup>th</sup> to 7<sup>th</sup> second-second sensing portions R0' to R7' may be arranged in the clockwise direction. As an example, when viewed in a plane, the 0<sup>th</sup> second-second sensing portion R0' may be arranged between the 0<sup>th</sup> first-second sensing portion T0' and the 1<sup>th</sup> first-second sensing portion T1', and the other second-second sensing portions R1' to R7' may be arranged in the clockwise direction, however, this is merely one example. The arrangement of the second-second sensing portions R0' to R7' should not be limited thereto or thereby.

The second-second sensing portions R0' to R7' may be connected to the second-first sensing portions R0 to R7, respectively, through the second connection patterns CP2. The second connection patterns CP2 may be connected to the second-first sensing portions R0 to R7 and the second-second sensing portions R0' to R7' through second contact holes T-CH2. The second contact holes T-CH2 will be described in more detail below.

The first sensing lines TL0 to TL7 may not overlap the first and second connection patterns CP1 and CP2. As an example, the first sensing lines TL0 to TL7 may not intersect the first and second connection patterns CP1 and CP2. The first connection patterns CP1 and the second connection patterns CP2 may not intersect each other, and thus, the connection patterns CP1 and the second connection patterns CP2 may not overlap each other.

The first sensing lines TL0 to TL7 may extend to the center area CA via portions of the first-first sensing portions T0 to T7 when viewed in a plane. The first sensing lines TL0 to TL7 may extend to the center area CA via portions of the second-first sensing portions R0 to R7 when viewed in a plane.

The first sensing lines TL0 to TL7 may extend via portions of some first-second sensing portions T3', T4' and T5' when viewed in a plane. The first sensing lines TL0 to TL7 may extend via portions of some second-second sensing portions R3' and R4' when viewed in a plane.

The second sensing lines RL0 to RL7 may be connected to the second-second sensing portions R0' to R7'. For example, the second sensing lines RL0 to RL7 may extend from the outer borders of the second-second sensing portions R0' to R7', respectively. The second sensing lines RL0 to RL7 may extend along the border of the active area AA having the circular shape in the inactive area NAA and may be connected to the third pads PD3.

As an example, eight first-first sensing portions T0 to T7, eight first-second sensing portions T0' to T7', eight second-first sensing portions R0 to R7, eight second-second sensing portions R0' to R7', eight first sensing lines TL0 to TL7, and eight second sensing lines RL0 to RL7 are shown. However, the number of the first-first sensing portions T0 to T7, the number of the first-second sensing portions T0' to T7', the number of the second-first sensing portions R0 to R7, the number of the second-second sensing portions R0' to R7', the number of the first sensing lines TL0 to TL7, and the number of the second sensing lines RL0 to RL7 should not be limited thereto or thereby.

A dummy sensing portion DSP may be further arranged in the center area CA. The dummy sensing portion DSP may be connected to one of the second-first sensing portions R0 to R7. As an example, the dummy sensing portion DSP may be connected to a 6<sup>th</sup> second-first sensing portion R6. The dummy sensing portion DSP may be connected to the second-first sensing portion R6 via one second connection pattern CP2 among the second connection patterns CP2. The second connection pattern CP2 may be connected to the dummy sensing portion DSP and the second-first sensing portion R6 via the second contact holes T-CH2.

According to an embodiment, the first sensing lines TL0 to TL7 may extend to the active area AA without extending to the inactive area NAA. The first sensing lines TL0 to TL7 may extend to the active area AA and may be connected to the first sensing electrodes TX0 to TX7 via the portions of the first and second sensing electrodes TX0 to TX7 and RX0 to RX7.

Accordingly, the first sensing lines TL0 to TL7 may not extend along the circular border of the active area AA in the inactive area NAA as the second sensing lines RL0 to RL7 do. As a result, an additional area for the arrangement of the first sensing lines TL0 to TL7 in the inactive area NAA is not required, and thus, the inactive area NAA may be reduced.

Figure 7:
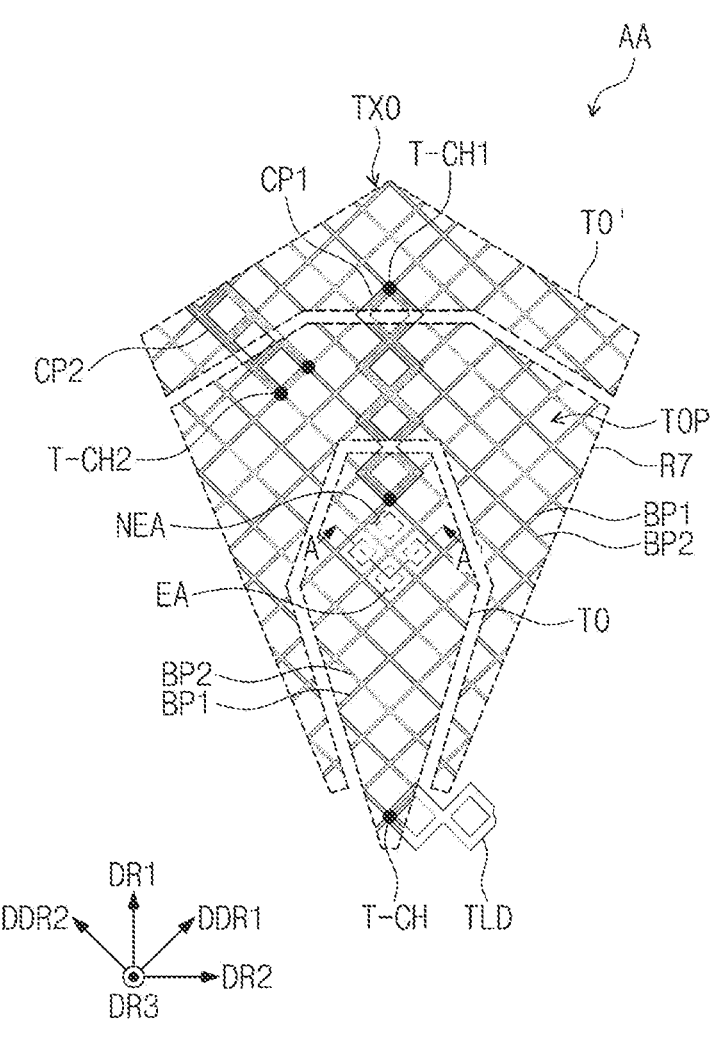
FIG. 7 is an enlarged plan view showing a $0^{th}$ first sensing electrode and a $7^{th}$ second-first sensing portion shown in FIG. 6A according to some embodiments of the present disclosure.

FIG. 7 is an enlarged plan view showing the $0^{th}$ first sensing electrode and the $7^{th}$ second-first sensing portion shown in FIG. 6A.

FIG. 7 is a view to explain configurations of the first and second sensing electrodes TX0 to TX7 and RX0 to RX7 in more detail.

Referring to FIG. 7, the first-first sensing portion T0, the first-second sensing portion T0', and the second-first sensing portion R7 may have a mesh shape. According to some embodiments, the other first-first sensing portions T1 to T7, the other first-second sensing portions T1' to T7', the other second-first sensing portions R0 to R6, and the second-second sensing portions R0' to R7' may also have the mesh shape.

Each of the first-first sensing portion T0, the first-second sensing portion T0', and the second-first sensing portion R7 may include a plurality of first branch portions BP1 extending in a first diagonal direction DDR1 and a plurality of second branch portions BP2 extending in a second diagonal direction DDR2 to have the mesh shape.

The first diagonal direction DDR1 may be defined to cross the first and second directions DR1 and DR2 on the plane defined by the first and second directions DR1 and DR2. The second diagonal direction DDR2 may be defined to cross the first diagonal direction DDR1 on the plane defined by the first and second directions DR1 and DR2. As an example, the first direction DR1 and the second direction DR2 may be perpendicular to each other, and the first diagonal direction DDR1 and the second diagonal direction DDR2 may be perpendicular to each other.

The first branch portions BP1 of each of the first-first sensing portion T0, the first-second sensing portion T0', and the second-first sensing portion R7 may cross the second branch portions BP2 of each of the first-first sensing portion T0, the first-second sensing portion T0', and the second-first sensing portion R7 and may be integrally formed with the second branch portions BP2 of each of the first-first sensing portion T0, the first-second sensing portion T0', and the second-first sensing portion R7. Touch openings TOP having a lozenge shape may be defined by the first branch portions BP1 and the second branch portions BP2.

A flat area of each of the pixels PX shown in FIG. 5 may include an emission area EA and a non-emission area NEA around the emission area EA. The non-emission area NEA may be arranged between the emission areas EA. A light emitting element of each of the pixels PX may be arranged in the emission area EA, and this structure will be described with reference to FIG. 8.

A light generated by the light emitting elements may be emitted through the emission areas EA. When viewed in a plane, the emission areas EA may be arranged in the touch openings TOP. As an example, four emission areas EA are shown, however, the emission areas EA may be substantially arranged in all the touch openings TOP shown in FIG. 7.

The first-first sensing portion T0, the first-second sensing portion T0', and the second-first sensing portion R7 may be arranged in the non-emission area NEA. As an example, the first branch portions BP1 and the second branch portions BP2 may be arranged in the non-emission area NEA. The first branch portions BP1 and the second branch portions BP2 may not be arranged in the emission areas EA.

Because the first and second branch portions BP1 and BP2 are arranged in the non-emission area NEA, the light generated by the light emitting elements may be normally emitted without being influenced by the first-first sensing portion T0, the first-second sensing portion T0', and the second-first sensing portion R7.

The first connection pattern CP1, the second connection pattern CP2, and the first sensing line TL0 may have the mesh shape in the active area AA and may extend along the first and second branch portions BP1 and BP2. The first connection pattern CP1, the second connection pattern CP2, and the first sensing line TL0 may not be arranged in the emission areas EA. According to some embodiments, the other first and second connection patterns CP1 and CP2 and the other first sensing lines TL1 to TL7 may also have the mesh shape in the active area AA, may not be arranged in the emission areas EA, and may extend along the first and second branch portions BP1 and BP2.

Figure 8:
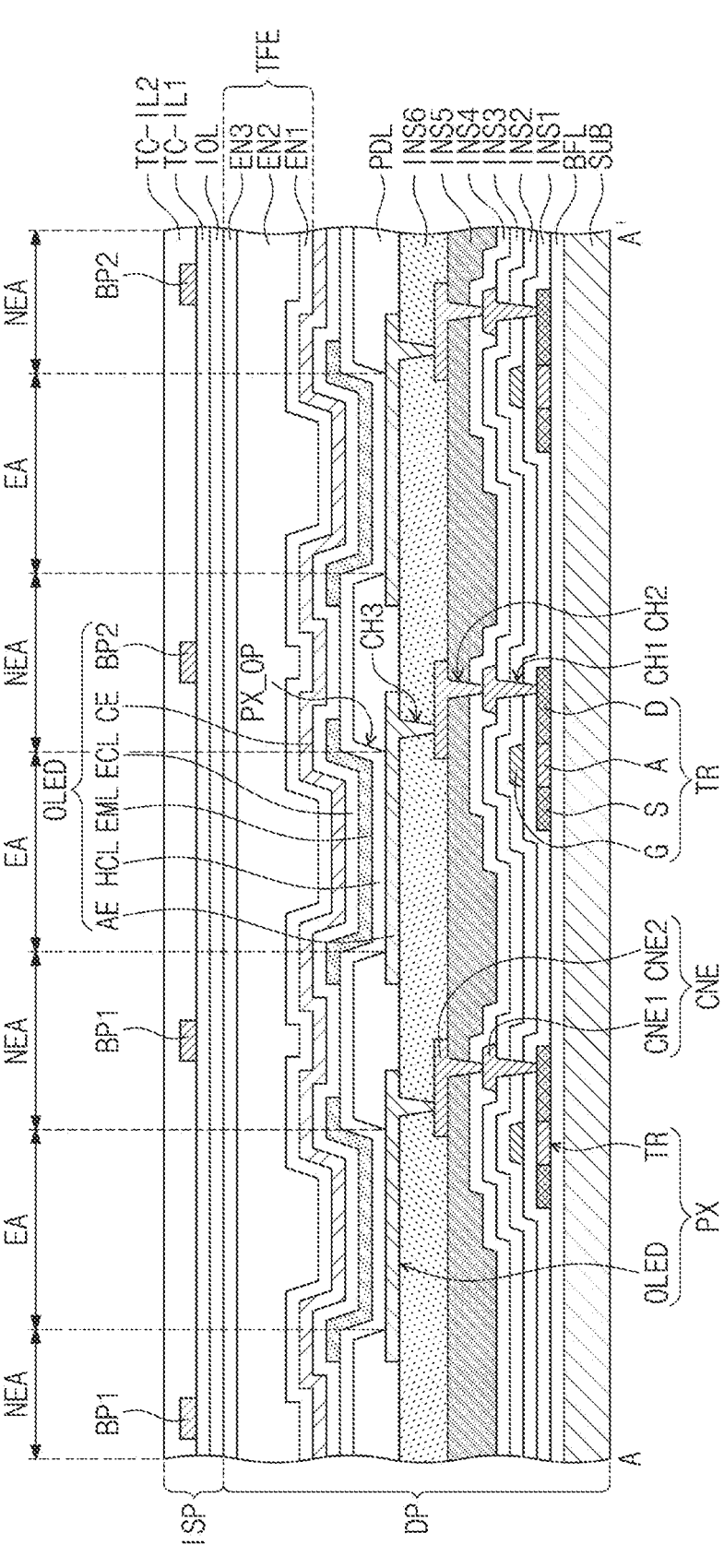
FIG. 8 is a cross-sectional view taken along a line A-A' shown in FIG. 7 according to some embodiments of the present disclosure.

FIG. 8 is a cross-sectional view taken along a line A-A' shown in FIG. 7.

Referring to FIG. 8, each of the pixels PX may include the transistor TR and the light emitting element OLED. The light emitting element OLED may be provided in plural, and the light emitting elements OLED may be arranged in the emission areas EA, respectively. The pixels PX may have substantially the same structure and function, and thus, hereinafter, a structure of one pixel PX will be described as a representative example.

The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be arranged on a substrate SUB. As an example, one transistor TR is shown in FIG. 8, however, the pixel PX may include a plurality of transistors and at least one capacitor to drive the light emitting element OLED.

A buffer layer BFL may be arranged on the substrate SUB, and the buffer layer BFL may be an inorganic layer. A semiconductor pattern may be arranged on the buffer layer BFL. The semiconductor pattern may include a polycrystalline silicon, an amorphous silicon, or a metal oxide.

The semiconductor pattern may be doped with an N-type dopant or a P-type dopant. The semiconductor pattern may include a high-doped region and a low-doped region. The high-doped region may have a conductivity greater than that of the low-doped region and may substantially serve as a source electrode and a drain electrode of the transistor TR. The low-doped region may substantially correspond to an active (or a channel) of the transistor TR.

A source S, an active A, and a drain D of the transistor TR may be formed from the semiconductor pattern. A first insulating layer INS1 may be arranged on the semiconductor pattern. A gate G of the transistor TR may be arranged on the first insulating layer INS1. A second insulating layer INS2 may be arranged on the gate G. A third insulating layer INS3 may be arranged on the second insulating layer INS2.

A connection electrode CNE may be arranged between the transistor TR and the light emitting element OLED to connect the transistor TR to the light emitting element OLED. The connection electrode CNE may include a first connection electrode CNE1 and a second connection electrode CNE2.

The first connection electrode CNE1 may be arranged on the third insulating layer INS3 and may be connected to the drain D through a first contact hole CH1 defined through the first, second, and third insulating layers INS1, INS2, and INS3. A fourth insulating layer INS4 may be arranged on the first connection electrode CNE1. A fifth insulating layer INS5 may be arranged on the fourth insulating layer INS4.

The second connection electrode CNE2 may be arranged on the fifth insulating layer INS5 and may be connected to the first connection electrode CNE1 through a second contact hole CH2 defined through the fourth and fifth insulating layers INS4 and INS5.

A sixth insulating layer INS6 may be arranged on the second connection electrode CNE2. Each of the first to sixth insulating layers INS1 to INS6 may be an inorganic layer or an organic layer.

The first electrode AE may be arranged on the sixth insulating layer INS6. The first electrode AE may be connected to the second connection electrode CNE2 through a third contact hole CH3 defined through the sixth insulating layer INS6. A pixel definition layer PDL may be arranged on the first electrode AE and the sixth insulating layer INS6 to expose a portion (e.g., a set or predetermined portion) of the first electrode AE. The pixel definition layer PDL may be provided with an opening PX_OP defined therethrough to expose the portion of the first electrode AE.

The hole control layer HCL may be arranged on the first electrode AE and the pixel definition layer PDL. The hole control layer HCL may be commonly arranged in the emission area EA and the non-emission area NEA. The hole control layer HCL may include a hole transport layer and a hole injection layer.

The light emitting layer EML may be arranged on the hole control layer HCL. The light emitting layer EML may be arranged in an area corresponding to the opening PX_OP. The light emitting layer EML may include an organic material and/or an inorganic material. The light emitting layer EML may generate a light having one of red, green, and blue colors.

The electron control layer ECL may be arranged on the light emitting layer EML and the hole control layer HCL. The electron control layer ECL may be commonly arranged in the emission area EA and the non-emission area NEA. The electron control layer ECL may include an electron transport layer and an electron injection layer.

The second electrode CE may be arranged on the electron control layer ECL. The second electrode CE may be commonly arranged in the emission area EA and the non-emission area NEA.

A layer on which the transistor TR is arranged may be referred to as the circuit element layer DP-CL. A layer on which the light emitting element OLED is arranged may be referred to as the display element layer DP-OLED.

The thin film encapsulation layer TFE may be arranged on the second electrode CE to cover the pixel PX. The thin film encapsulation layer TFE may include a first encapsulation layer EN1 arranged on the second electrode CE, a second encapsulation layer EN2 arranged on the first encapsulation layer EN1, and a third encapsulation layer EN3 arranged on the second encapsulation layer EN2.

Each of the first and third encapsulation layers EN1 and EN3 may be an inorganic layer, and the second encapsulation layer EN2 may be an organic layer. The first and third encapsulation layers EN1 and EN3 may protect the pixel PX from moisture and oxygen. The second encapsulation layer EN2 may protect the pixel PX from a foreign substance such as dust particles.

A first voltage may be applied to the first electrode AE via the transistor TR, and a second voltage may be applied to the second electrode CE. Holes and electrons injected into the light emitting layer EML may be recombined to generate excitons, and the light emitting element OLED may emit the light by the excitons that return to a ground state from an excited state.

An insulating layer IOL may be arranged on the thin film encapsulation layer TFE. The insulating layer IOL may be arranged on the third encapsulation layer EN3. The insulating layer IOL may include an inorganic insulating layer. At least one insulating layer IOL may be arranged on the thin film encapsulation layer TFE. As an example, two inorganic insulating layers IOL may be sequentially stacked on the thin film encapsulation layer TFE.

A first insulating layer TC-IL1 may be arranged on the insulating layer IOL, and the first and second branch portions BP1 and BP2 may be arranged on the first insulating layer TC-IL1. The first and second branch portions BP1 and BP2 may be arranged in the non-emission area NEA.

A second insulating layer TC-IL2 may be arranged on the first insulating layer TC-IL1 to cover the first and second branch portions BP1 and BP2. The first insulating layer TC-IL1 may include an inorganic insulating layer or an organic insulating layer. The second insulating layer TC-IL2 may include an organic insulating layer.

Hereinafter, the structure of the input sensing part in cross-section shown in FIGS. 6A and 6B will be described with reference to FIGS. 9 to 14.

Figure 9:
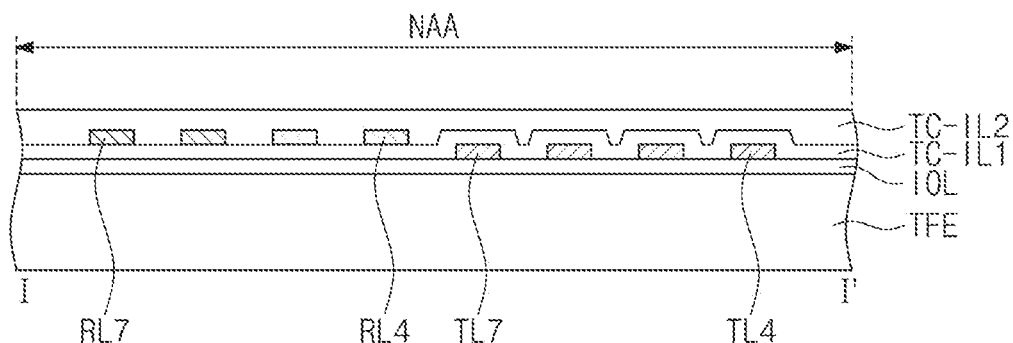
FIG. 9 is a cross-sectional view taken along a line I-I' shown in FIG. 6B according to some embodiments of the present disclosure.

FIG. 9 is a cross-sectional view taken along a line I-I' shown in FIG. 6B.

Referring to FIG. 9, the first sensing lines TL4 to TL7 may be arranged on the insulating layer IOL. According to some embodiments, the other first sensing lines TL0 to TL3 may also be arranged on the insulating layer IOL.

The first insulating layer TC-IL1 may be arranged on the first sensing lines TL4 to TL7. The first insulating layer TC-IL1 may be arranged on the insulating layer IOL to cover the first sensing lines TL4 to TL7.

The second sensing lines RL4 to RL7 may be arranged on the first insulating layer TC-IL1. According to some embodiments, the other second sensing lines RL0 to RL3 may also be arranged on the first insulating layer TC-IL1. Accordingly, the first sensing lines TL0 to TL7 may be arranged below the second sensing lines RL0 to RL7.

The second insulating layer TC-IL2 may be arranged on the second sensing lines RL4 to RL7. The second insulating layer TC-IL2 may be arranged on the first insulating layer TC-IL1 to cover the second sensing lines RL4 to RL7.

Figure 10:
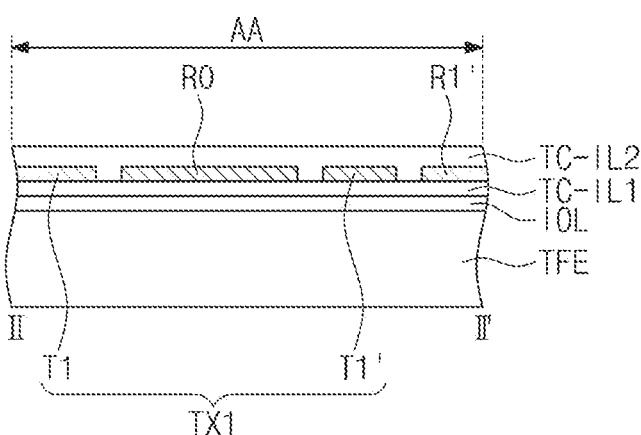
FIG. 10 is a cross-sectional view taken along a line II-II' shown in FIG. 6B according to some embodiments of the present disclosure.

FIG. 10 is a cross-sectional view taken along a line II-II' shown in FIG. 6B.

Referring to FIG. 10, the first-first sensing portion T1 and the first-second sensing portion T1' may be arranged on the first insulating layer TC-IL1. According to some embodiments, the other first-first sensing portions T0 and T2 to T7 and the other first-second sensing portions T0' and T2' to T7' may also be arranged on the first insulating layer TC-IL1. Accordingly, the first sensing electrodes TX0 to TX7 may be arranged on the first insulating layer TC-IL1. The second insulating layer TC-IL2 may be arranged on the first insulating layer TC-IL1 to cover the first-first sensing portion T1 and the first-second sensing portion T1'.

The second-first sensing portion R0 and the second-second sensing portion R1' may be arranged on the first insulating layer TC-IL1. According to some embodiments, the other second-first sensing portions R1 to R7 and the other second-second sensing portions R0' and R2' to R7' may also be arranged on the first insulating layer TC-IL1. Accordingly, the second sensing electrodes RX0 to RX7 may be arranged on the first insulating layer TC-IL1. The second insulating layer TC-IL2 may be arranged on the first insulating layer TC-IL1 to cover the second-first sensing portion R0 and the second-second sensing portion R1'.

Referring to FIGS. 9 and 10, the second sensing lines RL4 to RL7 may be arranged on the first insulating layer TC-IL1. Accordingly, the first and second sensing electrodes TX0 to TX7 and RX0 to RX7 and the second sensing lines RL0 to RL7 may be arranged on the same layer.

The first sensing lines TL0 to TL3 may be arranged below the second sensing lines RL4 to RL7. Accordingly, the first sensing lines TL0 to TL7 may be arranged below the first and second sensing electrodes TX0 to TX7 and RX0 to RX7 and the second sensing lines RL0 to RL7. In addition, the first insulating layer TC-IL1 may be arranged between the first sensing lines TL0 to TL7 and the first and second sensing electrodes TX0 to TX7 and RX0 to RX7 and between the first sensing lines TL0 to TL7 and the second sensing lines RL0 to RL7.

Figure 11:
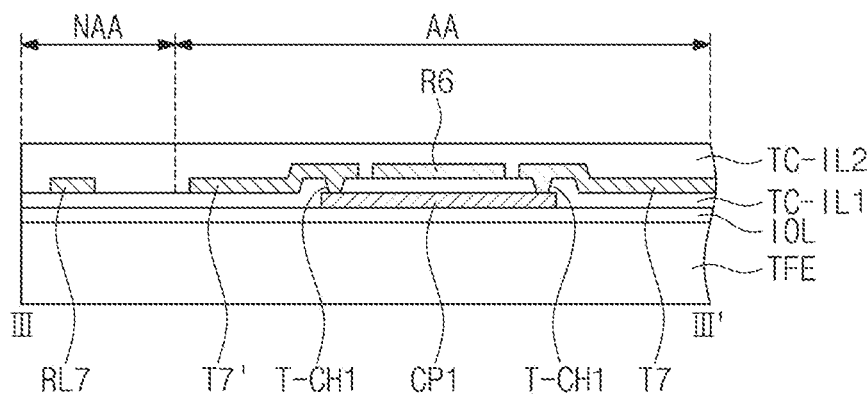
FIG. 11 is a cross-sectional view taken along a line III-III' shown in FIG. 6B according to some embodiments of the present disclosure.

FIG. 11 is a cross-sectional view taken along a line III-III' shown in FIG. 6B.

Referring to FIG. 11, the first connection pattern CP1 may be arranged on the insulating layer IOL, and the first insulating layer TC-IL1 may be arranged on the insulating layer IOL to cover the first connection pattern CP1. According to some embodiments, the other first connection patterns CP1 may also be arranged on the insulating layer IOL. Accordingly, the first connection patterns CP1 may be arranged on the same layer as a layer on which the first sensing lines TL0 to TL7 are arranged.

The first connection pattern CP1 may be arranged in the active area AA. The second sensing line RL7 may be arranged in the inactive area NAA.

The first-first sensing portion T7, the first-second sensing portion T7', and the second-first sensing portion R6 may be arranged on the first insulating layer TC-IL1 in the active area AA. Accordingly, the first connection patterns CP1 may be arranged under the first-first sensing portions T0 to T7 and the first-second sensing portions T0' to T7' and under the second-first sensing portions R0 to R7 and the second-second sensing portions R0' to R7'. In addition, the first insulating layer TC-IL1 may be arranged between each of the first-first, first-second, second-first, and second-second sensing portions T0 to T7, T0' to T7', R0 to R7, and R0' to R7' and the first connection patterns CP1.

The second insulating layer TC-IL2 may be arranged on the first insulating layer TC-IL1 to cover the second sensing line RL7, the first-first sensing portion T7, the first-second sensing portion T7', and the second-first sensing portion R6.

The first connection pattern CP1 may connect the first-first sensing portion T7 and the first-second sensing portion T7'. According to some embodiments, the other first connection patterns CP1 may also connect the other first-first sensing portions T0 to T6 and the other first-second sensing portions T0' to T6', respectively.

The first connection pattern CP1 may be connected to the first-first sensing portion T7 and the first-second sensing portion T7' via the first contact holes T-CH1 defined through the first insulating layer TC-IL1. According to some embodiments, the other first connection patterns CP1 may be connected to the other first-first sensing portions T0 to T6 and the other first-second sensing portions T0' to T6' via the other first contact holes T-CH1 defined through the first insulating layer TC-IL1.

Figure 12:
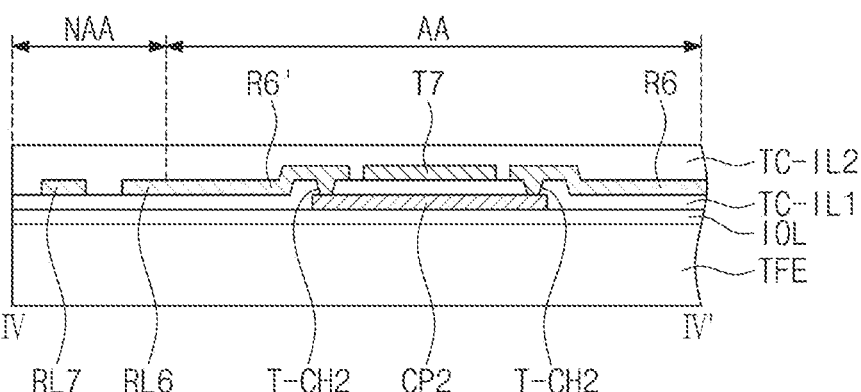
FIG. 12 is a cross-sectional view taken along a line IV-IV' shown in FIG. 6B according to some embodiments of the present disclosure.

FIG. 12 is a cross-sectional view taken along a line IV-IV' shown in FIG. 6B.

Referring to FIG. 12, the second connection pattern CP2 may be arranged on the insulating layer IOL, and the first insulating layer TC-IL1 may be arranged on the insulating layer IOL to cover the second connection pattern CP2. According to some embodiments, the other second connection patterns CP2 may also be arranged on the insulating layer IOL. Accordingly, the second connection patterns CP2 may be arranged on the same layer as the first connection patterns CP1 and the first sensing lines TL0 to TL7. The second connection pattern CP2 may be arranged in the active area AA.

The first-second sensing portion T7', the second-first sensing portion R6, and the second-second sensing portion R6' may be arranged on the first insulating layer TC-IL1 in the active area AA. Accordingly, the second connection patterns CP2 may be arranged under the first-first sensing portions T0 to T7 and the first-second sensing portions T0' to T7' and under the second-first sensing portions R0 to R7 and the second-second sensing portions R0' to R7'. In addition, the first insulating layer TC-IL1 may be arranged between each of the first-first, first-second, second-first, and second-second sensing portions T0 to T7, T0' to T7', R0 to R7, and R0' to R7' and the second connection patterns CP2.

The second insulating layer TC-IL2 may be arranged on the first insulating layer TC-IL1 to cover the first-second sensing portion T7', the second-first sensing portion R6, and the second-second sensing portion R6'.

The second connection pattern CP2 may connect the second-first sensing portion R6 and the second-second sensing portion R6'. According to some embodiments, the other second connection patterns CP2 may connect the other second-first sensing portions R0 to R5 and R7 and the other second-second sensing portions R0' to R5' and R7', respectively.

The second connection pattern CP2 may be connected to the second-first sensing portion R6 and the second-second sensing portion R6' via the second contact holes T-CH2 defined through the first insulating layer TC-IL1. According to some embodiments, the other second connection patterns CP2 may be connected to the other second-first sensing portions R0 to R5 and R7 and the other second-second sensing portions R0' to R5' and R7', respectively, via the other second contact holes T-CH2 defined through the first insulating layer TC-IL1.

The second sensing line RL6 may extend from the second-second sensing portion R6'. According to some embodiments, the other second sensing lines RL0 to RL5 and RL7 may extend from the other second-second sensing portions R0' to R5' and R7', respectively.

Figure 13:
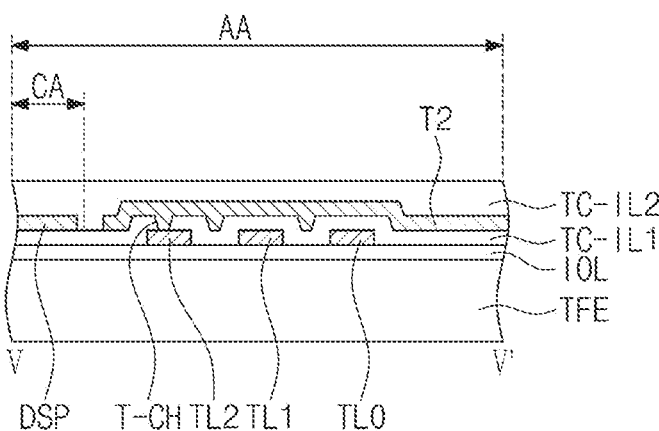
FIG. 13 is a cross-sectional view taken along a line V-V' shown in FIG. 6B according to some embodiments of the present disclosure.

FIG. 13 is a cross-sectional view taken along a line V-V' shown in FIG. 6B.

Referring to FIG. 13, the first sensing lines TL0, TL1, and TL2 may be arranged on the insulating layer IOL in the active area AA, and the first-first sensing portion T2 may be arranged on the first insulating layer TC-IL1. The dummy sensing portion DSP may be arranged on the first insulating layer TC-IL1 in the center area CA.

The first sensing line TL2 may be connected to the first-first sensing portion T2 via the contact hole T-CH defined through the portion of the first insulating layer TC-IL1 adjacent to the center area CA. Accordingly, the first sensing line TL2 may be connected to the first sensing electrode TX2 including the first-first sensing portion T2 and the first-second sensing portion T2' via the contact hole T-CH.

According to some embodiments, the other first sensing lines TL0, TL1, and TL3 to TL7 may be connected to the other first-first sensing portions T0, T1, and T3 to T7 via the other contact holes T-CH defined through portions of the first insulating layer TC-IL1 adjacent to the center area CA.

Accordingly, the first sensing lines TL0, TL1, and TL3 to TL7 may be connected to the first sensing electrodes TX0, TX1, and TX3 to TX7 via the contact holes T-CH.

Figure 14:
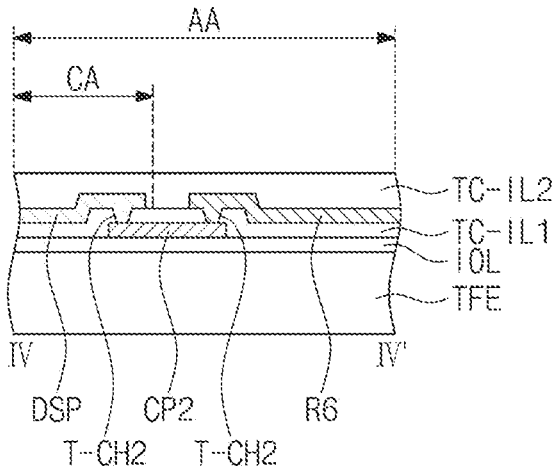
FIG. 14 is a cross-sectional view taken along a line VI-VI' shown in FIG. 6B according to some embodiments of the present disclosure.

FIG. 14 is a cross-sectional view taken along a line VI-VI' shown in FIG. 6B.

Referring to FIG. 14, the dummy sensing portion DSP arranged in the center area CA may be connected to the second-first sensing portion R6 via the second connection pattern CP2. The second connection pattern CP2 may be connected to the dummy sensing portion DSP and the second-first sensing portion R6 via the second contact holes T-CH2 defined through the first insulating layer TC-IL1.

Figure 15:
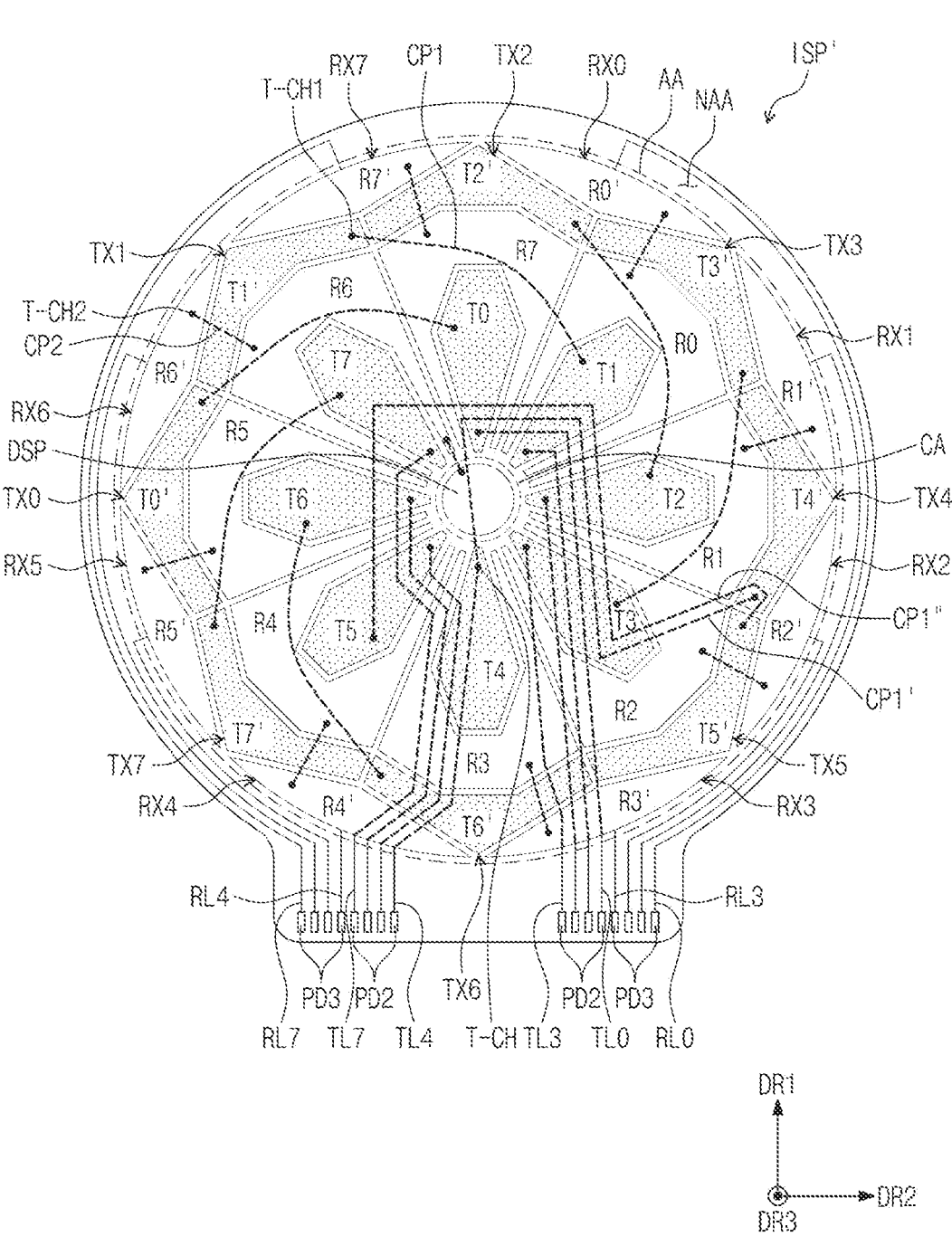
FIG. 15 is a plan view showing an input sensing part according to some embodiments of the present disclosure.

FIG. 15 is a plan view showing an input sensing part ISP' according to some embodiments of the present disclosure.

Hereinafter, in FIG. 15, features of the input sensing part ISP' different from those of the input sensing part ISP shown in FIG. 6A will be mainly described.

Referring to FIG. 15, $0^{th}$ to $7^{th}$ first-second sensing portions T0' to T7' may be arranged in the clockwise direction. As an example, when viewed in a plane, the $0^{th}$ first-second sensing portion T0' may be placed at 9 o'clock, and the other first-second sensing portions T1' to T7' may be arranged in the clockwise direction.

An h-th first-first sensing portion may extend in one direction, and an h-th first-second sensing portion may be spaced apart from the h-th first-first sensing portion in another direction crossing the one direction. As an example, in a case where the h is zero (h=0), a $0^{th}$ first-first sensing portion T0 may extend in the first direction DR1. The $0^{th}$ first-second sensing portion T0' may be spaced apart from the $0^{th}$ first-first sensing portion T0 in the second direction DR2 crossing the first direction DR1.

That is, the first-first sensing portion T0 and the first-second sensing portion T0', which correspond to each other in a sequential order, may not be arranged in a direction in which the first-first sensing portion T0 extends. Accordingly, the first-second sensing portions T0' to T7' respectively corresponding to first-first sensing portions T0 to T7 may be spaced apart from the first-first sensing portions T0 to T7 in a direction different from the extension direction of the first-first sensing portions T0 to T7.

First connection patterns CP1, CP1', and CP1" may extend from the first-first sensing portions T0 to T7 toward the first-second sensing portions T0' to T7'. The first connection patterns CP1, CP1', and CP1" may connect the first-first sensing portions T0 to T7 and the first-second sensing portions T0' to T7'. First sensing lines TL0 to TL7 may extend to a center area CA of an active area AA and may be connected to the first-first sensing portions T0 to T7.

The first connection patterns CP1, CP1', and CP1" may extend not to cross each other. The first connection patterns CP1, CP1', and CP1" may extend in various direction as long as the first connection patterns CP1, CP1', and CP1" may not cross second connection patterns CP2 and the first sensing lines TL0 to TL7. As an example, the first connection pattern CP1' connected to the first-second sensing portion T4' may extend not to cross the other first connection patterns CP1 and CP1", the first sensing lines TL0 to TL7, and the second connection patterns CP2 and may extend to the center area CA.

The first connection pattern CP1' may be connected to the first-first sensing portion T4 after passing through the center area. The first connection pattern CP1' and the first sensing line TL4 may be connected to the first-first sensing portion T4 via a contact hole T-CH.

Similarly, the first connection pattern CP1" connected to the first-first sensing portion T5 may extend not to cross the other first connection patterns CP1 and CP1', the first sensing lines TL0 to TL7, and the second connection patterns CP2. The first connection pattern CP1" may be connected to the first-second sensing portion T5' via the first-second sensing portion T4' after bypassing the center area CA.

Although the embodiments of the present disclosure have been described, it is understood that embodiments according to the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and their equivalents.

What is claimed is:

1. An input sensing part comprising:
a plurality of first sensing electrodes in an active area;
a plurality of second sensing electrodes in the active area and adjacent to the first sensing electrodes;
a plurality of first sensing lines in an inactive area around the active area, extending to the active area, and connected to the first sensing electrodes via portions of the first and second sensing electrodes in a plan view;
a plurality of second sensing lines in the inactive area and extending from the second sensing electrodes,
wherein a first group of the first sensing lines comprises a first sensing line and a second sensing line,
wherein each of the first sensing line and the second sensing line are connected respectively to first and second sensing electrodes that are adjacent to each other along sides in a radial direction and the first and second sensing electrodes are an equal radial distance from a center area of the active area,
the first sensing line and the second sensing line extend parallel to each other toward a center area of the active area, and the first sensing line and the second sensing line are bent in an area within the active area that is adjacent to the center area, such that each of the first sensing line and the second sensing line includes a first line segment and a second line segment in the area within the active area, and each of the first and second line segments are not colinear such that the first line segments extend parallel to each other, and the second line segments extend parallel to each other in a same direction from corresponding ones of the first line segments to corresponding ones of the first and second sensing electrodes, and
each of the first sensing line and the second sensing line is connected to a respective portion of each of the first and second sensing electrodes.

2. The input sensing part of claim 1, wherein the first and second sensing electrodes are on a same layer as the second sensing lines, and the first sensing lines are below the first and second sensing electrodes and the second sensing lines.

3. The input sensing part of claim 2, further comprising a first insulating layer between the first sensing lines and the first and second sensing electrodes, wherein the first sensing lines are connected to the first sensing electrodes via contact holes defined in portions of the first insulating layer adjacent to the center area.

4. The input sensing part of claim 1, wherein the first sensing electrodes comprise:
a plurality of first-first sensing portions adjacent to the center area and arranged in a radial shape with respect to the center area; and a plurality of first-second sensing portions spaced apart from the first-first sensing portions in the radial direction and respectively connected to the first-first sensing portions, wherein the first sensing lines are connected to portions of the first-first sensing portions adjacent to one sides of the first-first sensing portions, which face the center area.

5. The input sensing part of claim 4, wherein an h-th first-first sensing portion extends in one direction, an h-th first-second sensing portion is spaced apart from the h-th first-first sensing portion in the one direction, and h is an integer number equal to or greater than zero.

6. The input sensing part of claim 4, wherein an h-th first-first sensing portion extends in one direction, an h-th first-second sensing portion is spaced apart from the h-th first-first sensing portion in a direction crossing the one direction, and the h is an integer number equal to or greater than zero.

7. The input sensing part of claim 4, further comprising a plurality of first connection patterns below the first-first sensing portions and the first-second sensing portions to connect the first-first sensing portions and the first-second sensing portions, respectively.

8. The input sensing part of claim 7, wherein the first connection patterns are connected to the first-first sensing portions and the first-second sensing portions via first contact holes defined in a first insulating layer between the first-first and first-second sensing portions and the first connection patterns.

9. The input sensing part of claim 4, wherein the second sensing electrodes comprise:

a plurality of second-first sensing portions between the first-first sensing portions and the first-second sensing portions; and a plurality of second-second sensing portions spaced apart from the second-first sensing portions in the radial direction, outside the first-second sensing portions, and respectively connected to the second-first sensing portions, wherein the second sensing lines extend from the second-second sensing portions, and wherein the first sensing lines extend via portions of the first-first sensing portions, portions of some first-second sensing portions, portions of the second-first sensing portion, and portions of some second-second sensing portions in a plan view.

10. The input sensing part of claim 9, wherein the second-first sensing portions surround the other sides of the first-first sensing portions, respectively, except the one sides of the first-first sensing portions.

11. The input sensing part of claim 9, wherein the first-second sensing portions are adjacent to borders of the second-first sensing portions, which face outward.

12. The input sensing part of claim 9, wherein borders of each of the first-second sensing portions, which faces outward, comprises a first side and a second side, which form an angle smaller than 180 degrees, an h-th second-second sensing portion is between a first side of an h-th first-second sensing portion and a second side of an (h+1)th first-second sensing portion, and the h is an integer number equal to or greater than zero.

13. The input sensing part of claim 9, further comprising a plurality of second connection patterns below the second-first sensing portions and the second-second sensing portions to connect the second-first sensing portions and the second-second sensing portions, respectively.

14. The input sensing part of claim 13, wherein the second connection patterns connect the second-first sensing portions and the second-second sensing portions via second contact holes defined in a first insulating layer between the second-first and second-second sensing portions and the second connection patterns.

15. The input sensing part of claim 9, further comprising a dummy sensing portion in the center area, wherein the dummy sensing portion is connected to one second-first sensing portion among the second-first sensing portions.

16. An input sensing part comprising:

a plurality of first-first sensing portions adjacent to a center area and arranged in a radial shape with respect to the center area;

a plurality of first-second sensing portions spaced apart from the first-first sensing portions in a radial direction and connected to the first-first sensing portions;

a plurality of second-first sensing portions between the first-first sensing portions and the first-second sensing portions;

a plurality of second-second sensing portions spaced apart from the second-first sensing portions in the radial direction, outside the first-second sensing portions, and respectively connected to the second-first sensing portions;

a plurality of first sensing lines extending toward the center area and connected to the first-first sensing portions;

a plurality of second sensing lines extending from the second-second sensing portions, wherein the first sensing lines are bent in an area within an active area that is adjacent to the center area such that each first sensing line includes a first line segment and a second line segment in the area within the active area and the first and second line segments are not colinear such that the first line segments extend parallel to each other, and the second line segments extend parallel to each other in a same direction from corresponding ones of the first line segments to corresponding ones of the first and second sensing electrodes.

17. The input sensing part of claim 16, wherein the first sensing lines extend via portions of the first-first sensing portions, portions of some first-second sensing portions, portions of the second-first sensing portions, and portions of some second-second sensing portions in a plan view.

18. The input sensing part of claim 16, wherein the first sensing lines are connected to portions of the first-first sensing portions adjacent to sides of the first-first sensing portions, which face the center area.

19. A display device comprising:

a display panel; and an input sensing part on the display panel, the input sensing part comprising:

a plurality of first sensing electrodes in an active area;

a plurality of second sensing electrodes in the active area and adjacent to the first sensing electrodes;

a plurality of first sensing lines in an inactive area around the active area, extending to the active area, and connected to the first sensing electrodes via portions of the first and second sensing electrodes in a plan view;

a plurality of second sensing lines in the inactive area and extending from the second sensing electrodes, wherein a first group of the first sensing lines comprises a first sensing line and a second sensing line, wherein each of the first sensing line and the second sensing line are connected respectively to first and second sensing electrodes that are adjacent to each other along sides in a radial direction and the first and second sensing electrodes are an equal radial distance from a center area of the active area, the first sensing line and the second sensing line extend parallel to each other toward a center area of the active area, and the first sensing line and the second sensing line are bent in an area within the active area that is adjacent to the center area, such that each of the first sensing line and the second sensing line includes a first line segment and a second line segment in the area within the active area, and each of the first and second line segments are not colinear such that the first line segments extend parallel to each other, and the second line segments extend parallel to each other in a same direction from corresponding ones of the first line segments to corresponding ones of the first and second sensing electrodes, and each of the first sensing line and the second sensing line is connected to a respective portion of each of the first and second sensing electrodes.

20. An electronic device comprising:
a display device comprising:
a display panel; and
an input sensing part disposed on the display panel,
wherein the input sensing part comprising:
a plurality of first sensing electrodes in an active area;
a plurality of second sensing electrodes in the active area and adjacent to the first sensing electrodes;
a plurality of first sensing lines in an inactive area around the active area, extending to the active area, and connected to the first sensing electrodes via portions of the first and second sensing electrodes in a plan view; and a plurality of second sensing lines in the inactive area and extending from the second sensing electrodes, wherein a first group of the first sensing lines comprises a first sensing line and a second sensing line, wherein each of the first sensing line and the second sensing line are connected respectively to first and second sensing electrodes that are adjacent to each other along sides in a radial direction and the first and second sensing electrodes are an equal radial distance from a center area of the active area, the first sensing line and the second sensing line extend parallel to each other toward a center area of the active area, and the first sensing line and the second sensing line are bent in an area within the active area that is adjacent to the center area, such that each of the first sensing line and the second sensing line includes a first line segment and a second line segment in the area within the active area, and each of the first and second line segments are not colinear such that the first line segments extend parallel to each other, and the second line segments extend parallel to each other in a same direction from corresponding ones of the first line segments to corresponding ones of the first and second sensing electrodes, and each of the first sensing line and the second sensing line is connected to a respective portion of each of the first and second sensing electrodes.

* * * * *